United States Patent [19]

Cornish et al.

[11] 4,334,202

[45] Jun. 8, 1982

[54] BROADBAND FREQUENCY DIVIDER

[75] Inventors: William D. Cornish, Nepean; François A. Gauthier, Gatineau, both of Canada

[73] Assignee: Her Majesty the Queen in right of Canada, as represented by Minister of National Defence of Her Majesty's Canadian Government, Canada

[21] Appl. No.: 189,766

[22] Filed: Sep. 23, 1980

[30] Foreign Application Priority Data

Nov. 16, 1979 [CA] Canada .................................. 340023

[51] Int. Cl.³ ............................................ H01P 1/20
[52] U.S. Cl. ..................................... 333/218; 333/246
[58] Field of Search .............. 333/205, 224, 218, 116, 333/238, 246; 363/158

[56] References Cited

U.S. PATENT DOCUMENTS

| | | | |
|---|---|---|---|
| 2,964,718 | 12/1960 | Packard | 333/224 X |
| 3,311,811 | 3/1967 | Rupp | 333/218 |
| 3,381,208 | 4/1968 | Miyahira | 333/218 |
| 3,512,110 | 5/1970 | Clar | 333/116 |
| 4,152,680 | 5/1979 | Harrison | 333/218 |

Primary Examiner—Paul L. Gensler
Attorney, Agent, or Firm—Larson & Taylor

[57] ABSTRACT

A microwave frequency divider operable in 8-16 GHZ range. A circuit resonant at a subharmonic frequency is formed by a pair of input microstrip transmission lines coupled to a pair of output microstrip transmission lines. Each input line is terminated by a varactor diode. The input signal is supplied to the resonant circuit by a pair of microstrip lines functioning as a two stage quarter wave transformer. A metal plate positioned over the resonant circuit and closely spaced from it functions to extend the upper end of the frequency range. A bias supply line for the diodes has a portion passing through a resistive foam block to remove spurious signals. A movable stub is positioned along the bias supply line to extend the lower end of the frequency range.

4 Claims, 4 Drawing Figures

BROADBAND FREQUENCY DIVIDER

This invention relates to broadband frequency dividers operating in the range 8-16 GHz.

Such a frequency divider is described in applicant's Canadian Pat. No. 1,041,614, issued Oct. 31, 1978, naming Robert G. Harrison as inventor and corresponding to U.S. Pat. No. 4,152,680, issued May 1, 1979. In that patent a frequency divider is described using varactor diodes. A pair of input microstrip transmission lines and a pair of output microstrip transmission lines are arranged to form a circuit resonant at the subharmonic frequency, each input line being terminated by a varactor diode. A microstrip line supplies a signal to the resonant circuit and a coplanar waveguide balun transmits the frequency divided output signal.

The present application relates to improvements in such frequency dividers as are necessary to ensure operation at all frequencies in the range 8-16 GHz. Specifically, the present invention is used in a microwave frequency divider having a circuit resonant at a subharmonic frequency formed by a pair of input microstrip transmission lines and a pair of output microstrip transmission lines, each input line being terminated by a varactor diode, the output lines being connected to a coplanar waveguide balun, and having a bias supply line with a quarter wavelength section connected to the varactor diode. This invention relates to the improvement comprising a metal plate substantially co-extensive with the resonant circuit and closely spaced therefrom.

In particular embodiments, further improvements in performance are obtained by including a two stage quarter wave transformer coupling the input signal to the resonant circuit; including a resistive foam element around a conductor connected between the bias supply line and a source of potential; and including a movable stub positioned along the bias supply line.

One embodiment of the invention will be described in detail with reference to the accompanying drawings in which:

FIG. 4 is a perspective view of the resistive foam element surrounding the bias supply conductor.

DESCRIPTION OF THE PREFERRED EMBODIMENT

Figure 1:
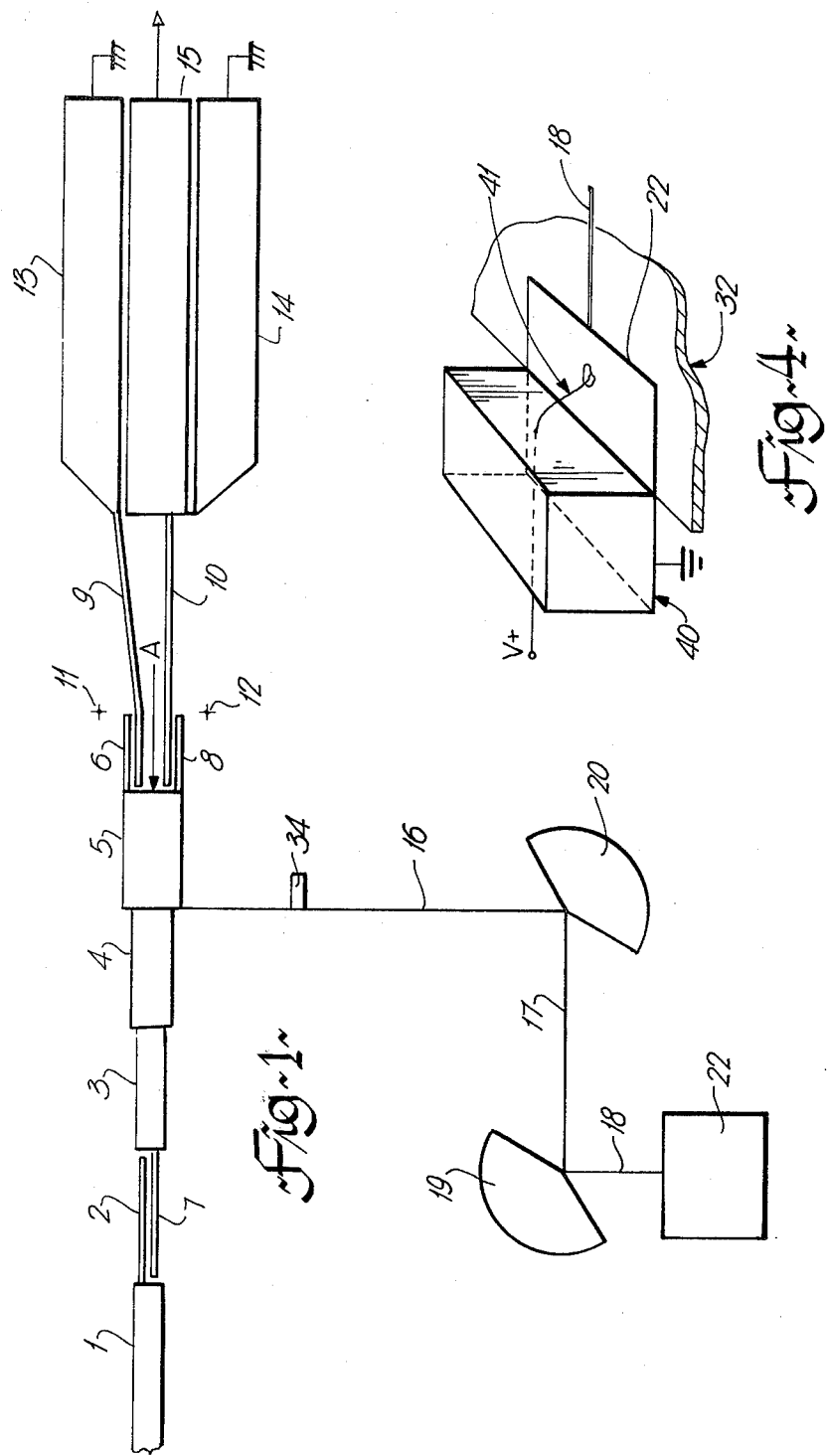
FIG. 1 is a plan view of frequency divider according to this invention.

FIG. 1 shows the basic circuit employed. Line 1 is a 50Ω input line. Lines 2 and 7 form a broadband dc block which couples microwave energy from line 1 to line 3. Line 3 is also a 50Ω line. The lengths of lines 2 and 7 are calculated to be ¼ wavelength for the middle of the frequency band of interest. Lines 4 and 5 provide impedance matching between line 3 and the lines 6 and 8. Points 11 and 12 are the centres for holes which are drilled through the dielectric substrate to accommodate the varactor diodes. The two varactor diodes are placed in the holes with their cathodes soldered to the end of line 6 and line 8 respectively. The anodes of the diodes are soldered to the ground plane on the underside of the microstrip. The diodes at 11 and 12 in conjunction with the lines 6 and 8 form a resonant circuit designed to resonate at one half the input frequency. Lines 9 and 10 couple the resulting resonant frequency to the balun which is made of lines 13, 14 and 15. Lines 13 and 14 are grounded as shown at the output end. Lines 14 and 15 are electrically connected at the input end. The subharmonic signal that enters the balun via lines 9 and 10 is balanced and is transformed to an unbalanced signal which is output from line 15. The balun section is formed from coplanar waveguide. That is, it does not have a ground plane.

Lines 16, 17 and 18 provide a dc path to apply a bias voltage to the varactor diodes. The fan sections 19 and 20 serve as broadband short circuits at the input microwave frequency and are used to prevent microwave transmission through the bias lines. As is known, if short circuits are positioned at distances $n/4\lambda$ (where $n = 1, 3, 5, 7 \ldots$, and $\lambda$ is the wavelength) along the lines 16 and 17 then line 16 appears as an open circuit where it intersects line 5.

Figure 2:
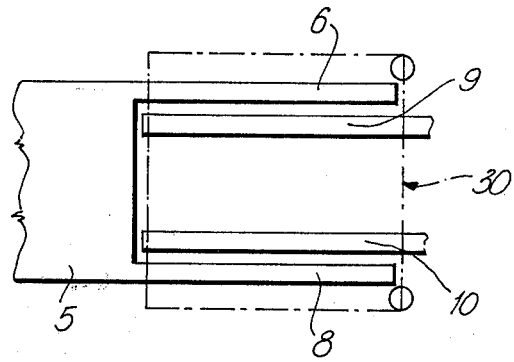
FIG. 2 is a plan view of the resonant circuit section with the metallic plate shown in dotted lines.
Figure 3:
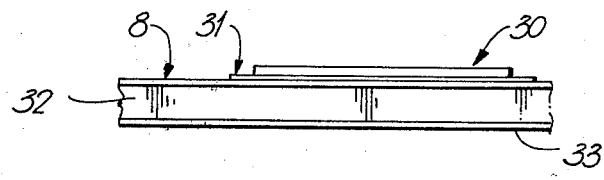
FIG. 3 is a side view of the resonant circuit section shown in FIG. 2.

It has been found that the upper end of the frequency range of the divider can be extended to 16 GHz by positioning a metal plate over the resonant section of the circuit as shown in dotted lines at 30 in FIGS. 2 and 3. The metal tab is insulated from the resonator by a sheet 31 of Teflon with a nominal thickness of 0.002 in. When this is done the upper end of the frequency range is extended to 16 GHz by adjusting the position of the metal tab. Applicant considers that this result may be due to the fact that the plate capacitively loads the resonator and therefore increases its resonant frequency. As well a better input impedance match is obtained by providing a better match for the reactive part of the input impedance. Line 8 is seen on the upper surface of dielectric 32 and 33 is the ground plane of the microstrip transmission lines.

It has been found that the lower end of the frequency range can be extended to 8 GHz by placing a small metal stub 34 on line 16 as shown in FIG. 1. Because the fan sections 19 and 20 are designed for 12 GHz, they are less efficient at low frequencies. The metal stub can be moved along line 16 until division occurs down to 8 GHz. The addition of the metal stub allows a certain amount of tuning after the circuit has been etched on the substrate, and it is therefore more desirable than fixing its position by etching.

A further feature of the divider circuit relates to the biasing circuit. The bandwidth of the divider is dependent on the varactor bias voltage. Typically the diodes are forward biased between 0.0 and +0.8 volts, the actual value depending on the individual diodes. The bias circuit introduces spurious signals that appear as though a low frequency ($\simeq 40$ MHz) signal is modulating the rf input signal. The present invention overcomes this problem by passing the bias wire 41 through a block of resistive foam 40 as shown in FIG. 4. The resistive foam acts as a high impedance to ground for the dc bias voltage but at higher frequencies is conductive enough to stop the oscillations which modulate the rf input impedance. Standard carbon impregnated foam has been found to be suitable.

We claim:

1. In a microwave frequency divider having a circuit resonant at a subharmonic frequency formed by a pair of input microstrip transmission lines and a pair of output microstrip transmission lines, each input line being terminated by a varactor diode, the output lines being connected to a coplanar waveguide balun, a bias supply line having a quarter wavelength section connected to the varactor diodes, the improvement comprising a metal plate, physically isolated from ground and disposed so as to be substantially co-extensive with the resonant circuit and in closely spaced relation thereto, for capacitively loading the resonant circuit and thereby increasing the resonant frequency thereof and providing an improved match for the reactive part of the input impedance.

2. A microwave frequency divider as set out in claim 1 further including a two stage quarter wave transformer coupling the input signal to the resonant circuit.

3. A microwave frequency divider as set out in claim 2 further including a resistive foam element around a conductor connected between said bias supply line and a source of potential.

4. A microwave frequency divider as set out in claim 3 further including a movable stub positioned along said bias supply line.

* * * * *